(12) United States Patent
Bandara et al.

(10) Patent No.: US 6,965,152 B1
(45) Date of Patent: Nov. 15, 2005

(54) BROAD-BAND QUANTUM WELL INFRARED PHOTODETECTORS

(75) Inventors: Sumith V. Bandara, Valencia, CA (US); Sarath D Gunapala, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 730 days.

(21) Appl. No.: 09/198,059

(22) Filed: Nov. 23, 1998

Related U.S. Application Data

(60) Provisional application No. 60/066,801, filed on Nov. 26, 1997.

(51) Int. Cl.[7] .............................................. H01L 27/14
(52) U.S. Cl. ....................................... 257/431; 257/440
(58) Field of Search .............................. 257/14, 15, 17, 257/21, 22, 23

(56) References Cited

U.S. PATENT DOCUMENTS

| | | | |
|---|---|---|---|
| 4,903,101 A | | 2/1990 | Maserjian |
| 5,013,918 A | * | 5/1991 | Choi ........................ 250/338.4 |
| 5,036,371 A | | 7/1991 | Schwartz |
| 5,198,659 A | * | 3/1993 | Smith et al. ............. 250/214.1 |
| 5,539,206 A | | 7/1996 | Schimert |
| 5,646,421 A | * | 7/1997 | Liu ............................. 257/21 |

FOREIGN PATENT DOCUMENTS

EP 0509247 A2 * 10/1992

OTHER PUBLICATIONS

Khanna et al., High Energy Proton and Alpha Radiation Effects on GaAs/AlGaAs Quantum Well Infrared Photodetectors. Dec. 1996, IEEE Trans. on Nuc. Sci., V43, pp 3012-3018.*

* cited by examiner

Primary Examiner—Douglas A. Wille
(74) Attorney, Agent, or Firm—Fish & Richardson P.C.

(57) ABSTRACT

A quantum well can be designed to detect light of a particular wavelength by tailoring the potential depth and width of the well. The design produces two energy states in the well separated by the desired photon energy. The GaAs/$Al_xGa_{1-x}As$ material system allows the quantum well shape to be varied over a range wide enough to enable light detection at wavelengths longer than approximately 6 $\mu m$. Hence, large bandgap materials such as GaAs/$Al_xGa_{1-x}As$ material has made fabrication of a large focal plane arrays tuned to detect light at wavelengths from 6 to 25 $\mu m$ possible.

33 Claims, 4 Drawing Sheets

BROAD-BAND QUANTUM WELL INFRARED PHOTODETECTORS

CROSS-REFERENCE TO RELATED APPLICATIONS

This application claims benefit of the priority of U.S. Provisional Application Ser. No. 60/066,801, filed Nov. 26, 1997 and entitled "Broad-Band Quantum Well Infrared Photodetectors."

ORIGIN OF INVENTION

The invention described herein was made in performance of work under a NASA contract, and is subject to the provisions of Public Law 96-517 (35 U.S.C. 202) in which the Contractor has elected to retain title.

TECHNICAL FIELD

The present specification generally relates to infrared photodetectors. More particularly, the present specification describes long wavelength infrared photodetectors based on multi- quantum well structures.

A quantum well is a nano-scale well with electrons in it. Normally, the electrons are in a state of rest. However, when a photon, a smallest energy packet in a beam of light, disturbs the electrons, the electrons move in the well. The photon may disturb the electrons sufficiently to move the electrons out of the well. Once the electrons are excited out of the well, they produce a current. The current is proportional to the photon intensity hitting the well. By measuring that current, the photodetector can determine how much light comes from various sources at the scene being photographed.

Typical photodetectors, such as charge coupled devices in modern video cameras, trigger when the light has enough energy to knock electrons loose from a detector, creating an electric current. Infrared light has longer wavelength than visible light. Such longer wavelengths of light have less energy to give to the electrons. Thus, an infrared detector must typically be kept colder than a visible light detector to avoid confusion with thermal dark currents.

Typical infrared (IR) detectors in the long-wavelength range (8 to 20 $\mu$m) can be fabricated by utilizing the interband transition which promotes an electron across a band gap from a valence band to a conduction band. These electrons are efficiently collected with an external circuit by producing a photocurrent. Since an incoming photon must promote an electron from the valence band to the conduction band, the energy of the photon must be higher than the band gap of the photosensitive material. Therefore, the spectral response of the detectors can be controlled by adjusting the band gap of the photosensitive material. Hence, the detection of a very long-wavelength IR radiation (up to 20 $\mu$m) requires small band gap materials down to 62 meV. Examples of materials meeting such requirements include $Hg_{1-x}Cd_xTe$ and $Pb_{1-x}Sn_xTe$ in which the energy gap can be controlled by varying x. It is well-known that these small band gap materials are more difficult to grow and process than large band gap semiconductors such as GaAs. These difficulties motivate the investigation of utilizing the intersubband transitions in multi-quantum well structures made of large band gap semiconductors.

When the quantum well is sufficiently deep and narrow, its energy states are quantized. The potential depth and width of the well are adjusted so that it holds only two energy states: a ground state near the well bottom 104, and a first excited state near the well top 102. A photon striking the well excites 114 an electron in the ground state to the first excited state. The electron in this excited state is swept out by an externally-applied voltage to produce a photocurrent 112. Only photons having energies corresponding to the energy separation between the two states are absorbed, resulting in a detector with a sharp absorption spectrum.

Performance of the quantum well photodetectors depend on the amount of "dark current" 106–110. The dark current is the current that flows through a biased detector in the dark, i.e., with no photons impinging on it. There are three sources for the dark current in quantum well photodetectors. First, sequential tunneling of ground state electrons from well to well 106 dominates the dark current at temperatures less than 30° K. and is reduced by widening the barriers. Then at intermediate temperatures, the dark current appears as thermionic emission of ground state electrons toward the well top followed by tunneling through the barrier tip 108 into the energy continuum above the wells and barriers. Finally, at temperatures above 45° K., the dark current is entirely dominated by classic thermionic emission of ground state electrons directly out of the well into the energy continuum 110. Minimizing this last source of the dark current is critical for an operation of a high-temperature focal plane array of an infrared camera.

To optimize the performance of the focal plane array, a quantum well unit is designed by placing the first excited state almost at the well top 102. This design is called bound-to-quasibound quantum well. Dropping the first excited state very near the well top causes the barrier to thermionic emission to be increased. This barrier increase causes the dark current 106–110 to drop while preserving the photocurrent 112.

However, the dropping of the first excited state very near the well top has a side-effect of narrowing the spectral response of the bound-to-quasibound quantum well infrared detector. Typical spectral response of the bound-to-quasibound detectors is tuned to a narrow band pass ($\Delta\lambda/\lambda_p$ of approximately 10%) because the band is mainly determined by the width of the excited state of the quantum well.

SUMMARY

The present disclosure describes a broad band quantum well infrared photodetector structure 200 comprising multiple quantum wells and barriers. The inventors noticed that by forming a multi-quantum well structure with different barrier thicknesses and well widths and heights, the spectral response of the bound-to-quasibound detectors can be broadened.

A quantum well can be designed to detect light of a particular wavelength by tailoring the potential depth and width of the well. The design produces two energy states in the well separated by the desired photon energy. The GaAs/$Al_xGa_{1-x}As$ material system allows the quantum well shape to be varied over a range wide enough to enable light detection at wavelengths longer than approximately 6 $\mu$m. Hence, large bandgap materials such as GaAs/$Al_xGa_{1-x}As$ material has made fabrication of a large focal plane arrays tuned to detect light at wavelengths from 6 to 25 $\mu$m possible.

A quantum well-barrier period consists of a 3 to 10 nm well of GaAs doped with n-type Si and a 50 to 60 nm barrier of $Al_xGa_{1-x}As$. Many of these quantum well-barrier periods (typically 50) are laid out in an array to increase photon absorption. Ground state electrons are provided in the detector by doping the GaAs well layers with Si. This photosensitive multi-quantum well structure is placed between 0.5 $\mu$m GaAs top and bottom contact layers doped with $5\times10^{17}$ cm$^{-3}$ n-type Si. The structure is grown on a semi-insulating GaAs substrate by molecular beam epitaxy method. Then, a GaAs cap layer of about 1 $\mu$m thick is grown on top of the photosensitive multi-quantum well layers.

According to a particular embodiment, the quantum well units consist of a plurality of quantum wells and barriers. The quantum wells are of variable widths and are formed from GaAs material. The barriers separate the wells and are formed from $Al_xGa_{1-x}As$ material with a particular Al content x. In a preferred embodiment, the quantum well unit has three wells and three barriers. The three well widths are varied to respond at peak wavelengths of 13.5 $\mu$m, 14.3 $\mu$m and 15.5 $\mu$m respectively, such that the full width of the spectral band at the half maximum covers 13.2 to 16.6 $\mu$m. The thickness of the barriers is kept uniform at 60 nm. In another preferred embodiment, the thickness of the outer barrier is kept at 60 nm while that of the inner barriers is reduced to 6 nm.

In an alternative embodiment, a multi-quantum well structure is constructed with a plurality of quantum well units. In further preferred embodiment, the multi-quantum well structure is formed with 17 quantum well units.

In another embodiment, a broad-band quantum well infrared photodetector focal plane array is formed. It has top and bottom contact layers made of GaAs material on each side of the multi-quantum well structures arranged in an array. In a particular embodiment, the array size can be 640 by 480. The thickness of each contact layer is 0.5 $\mu$m. The preferred quantum well infrared photodetector is a bound to quasi-bound quantum well infrared photodetector.

In a further embodiment, the wells of the quantum well unit are formed from $Al_yGa_{1-y}As$ material with a particular Al content y. Variation of the Al content allows the range of spectral band to vary over wider scale and cover different wavelength range.

The disclosure also covers a method of fabricating focal plane array based on multi-quantum well structures. The method consists of doping a bottom contact layer made of GaAs material with n-type Si, laying the bottom contact layer, growing a plurality of multi-quantum well structures on the bottom contact layer by molecular beam epitaxy, coupling a top contact layer to the plurality of structures, and growing a GaAs cap layer of approximately 1 $\mu$m on top of the top contact layer.

The details of one or more embodiments are set forth in the accompanying drawings and the description below. Other embodiments and advantages will become apparent from the following description and drawings, and from the claims.

BRIEF DESCRIPTION OF THE DRAWINGS

Like reference numbers and designations in the various drawings indicate like elements.

DETAILED DESCRIPTION

The present disclosure describes a broad band quantum well infrared photodetector. The $GaAs/Al_xGa_{1-x}As$ material system allows the quantum well parameters to be varied over a range that is wide enough to enable light detection at any wavelength range between 6 and 20 $\mu$m. That is, a peak responsivity wavelength is varied between 6 and 20 $\mu$m. Responsivity is the ratio of the photosignal to the radiation power incident on the detector and is measured in the unit of amperes per watts. A higher responsivity indicates a more sensitive detector.

Figure 1:
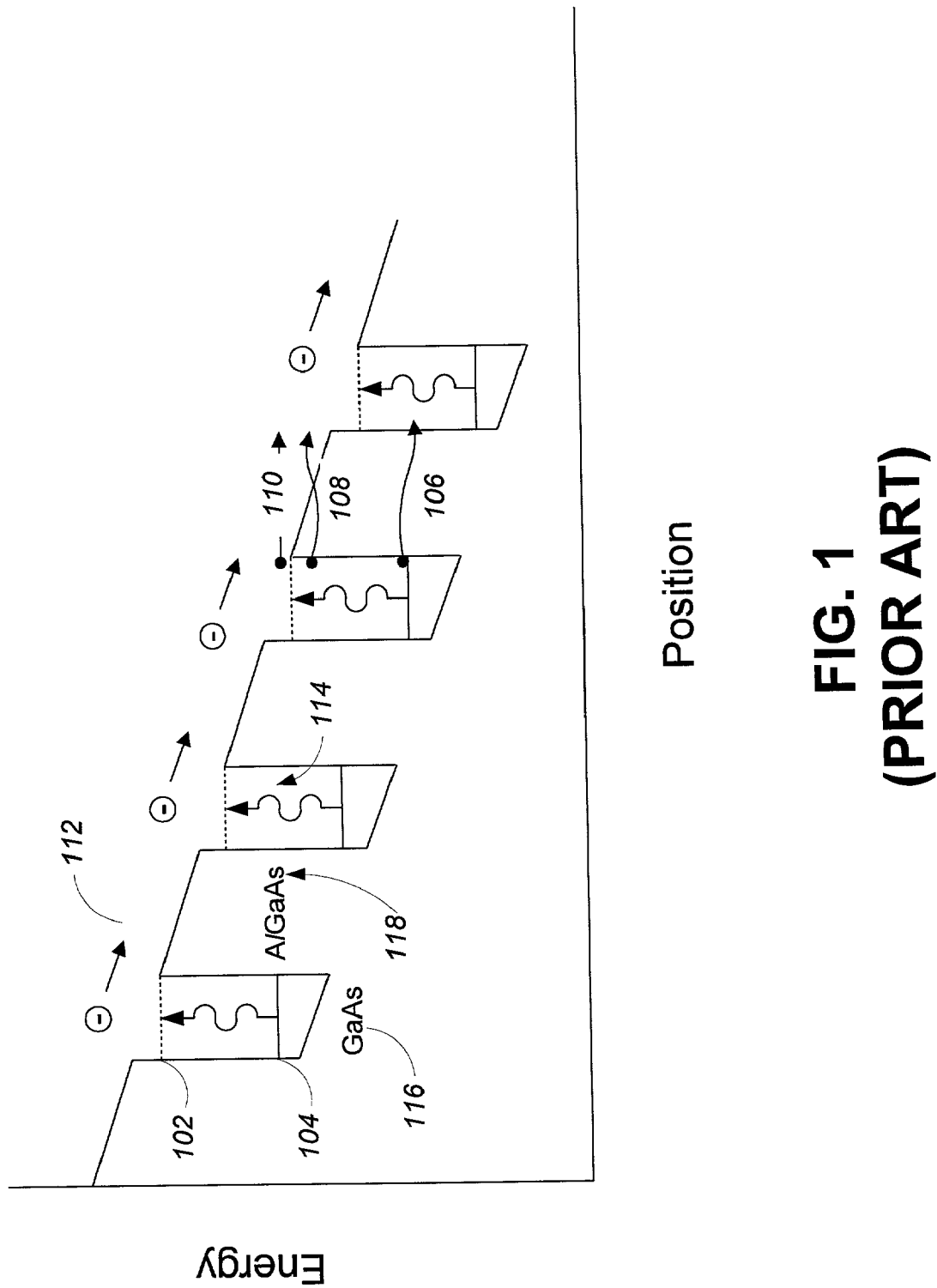
FIG. 1 is a prior art diagram of quantum wells showing movements of electrons from ground state to high energy levels creating photocurrents. Paths of dark currents are also shown.
Figure 2:
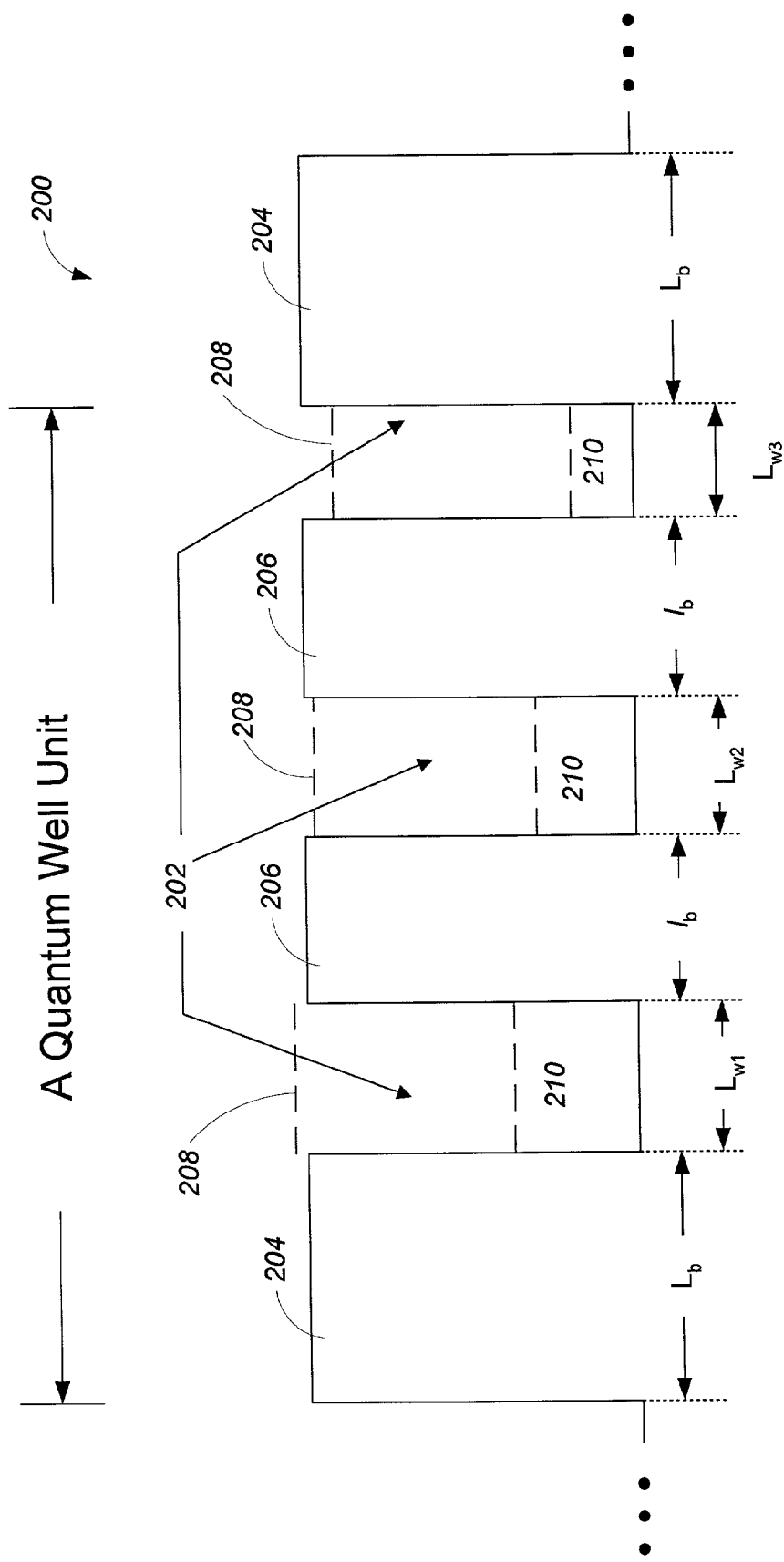
FIG. 2 is a diagram of a quantum well unit showing three GaAs quantum wells and three $Al_xGa_{1-x}As$ barriers.

The positions of the ground and excited states of the quantum well are determined by the quantum well width ($L_w$) and the barrier height, i.e., the Al mole fraction x of the barrier. Using this concept, a broad-band multi-quantum well unit 200 is designed by placing several quantum wells 202 with different well widths but keeping the Al mole fraction at a fixed value. Since each quantum well width ($L_{wi}$) corresponds to a spectral band pass of approximately 1.5 $\mu$m, three different well widths ($L_{w1}$, $L_{w2}$ and $L_{w3}$) are sufficient to cover approximately 12 to 16 $\mu$m range. FIG. 2 shows an example of a three-quantum well unit.

Figure 3:
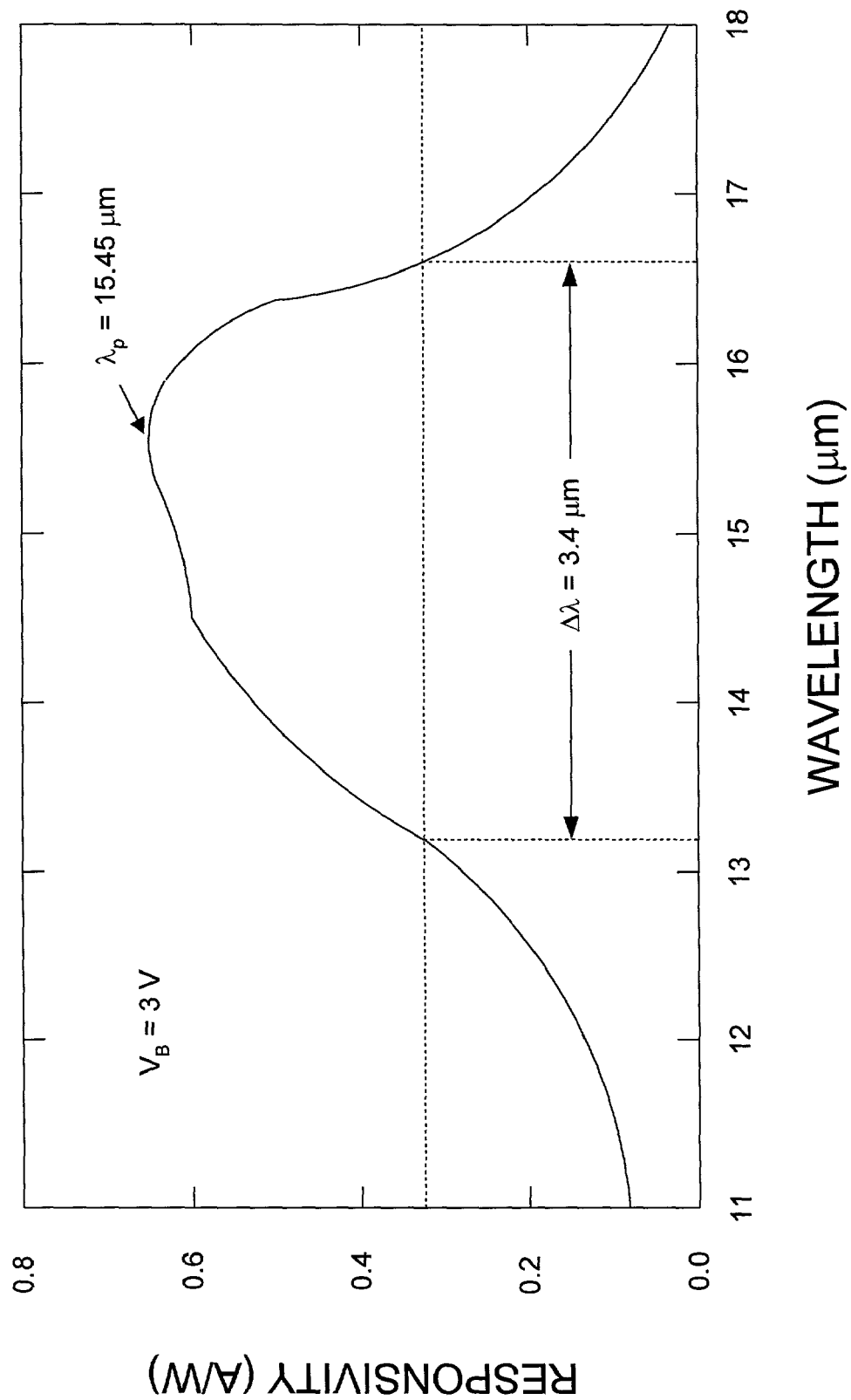
FIG. 3 is a graph of an experimental measurement of the responsivity spectrum of a broad-band quantum well infrared photodetector based on 17 repeated layers of a three-quantum well unit of FIG. 2 with all the barrier thicknesses set at 60 nm.

FIG. 3 shows experimental measurements of the responsivity spectrum of the broad-band quantum well infrared photodetector based on three-quantum well unit. The photodetector used in the experiment had 17 repeated units laid out in an array with 60 nm thick ($L_b$=$l_b$) $Al_xGa_{1-x}As$ barriers 204 and 206. The thicknesses of the three quantum wells 202 are designed to respond at peak wavelengths of 13.5 $\mu$m, 14.3 $\mu$m and 15.5 $\mu$m respectively. The experimental measurements show broadening of the spectral response up to $\alpha\lambda$ of approximately 3.4 $\mu$m, i.e., the full width at the half maximum from 13.2 to 16.6 $\mu$m. This broadening of the spectral response bandwidth ($\Delta\lambda/\lambda_p$ of approximately 22%) is more than a 200% increase from a typical prior art quantum well infrared photodetector.

Figure 4:
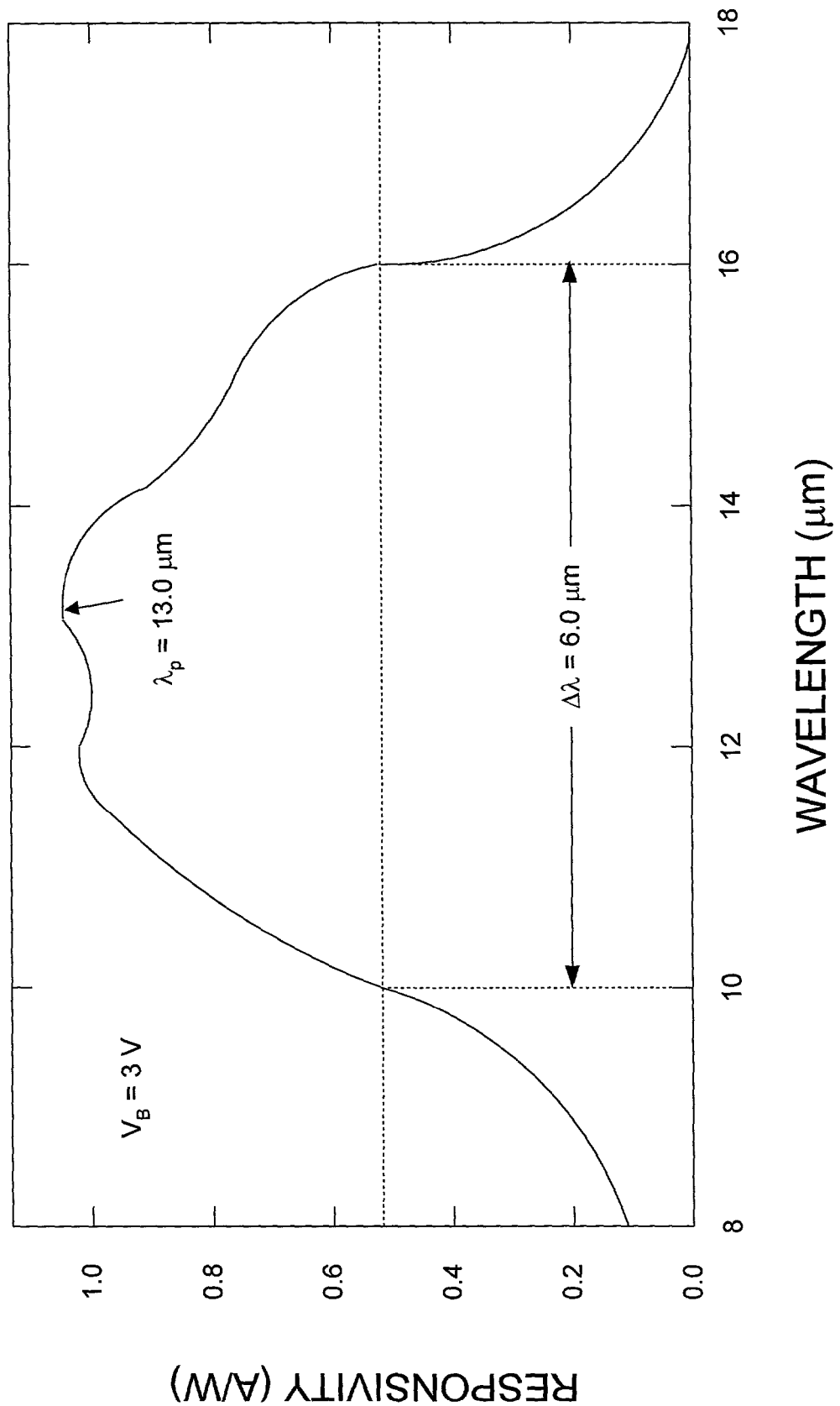
FIG. 4 is a graph of an experimental measurement of the responsivity spectrum of a broad-band quantum well infrared photodetector based on 35 repeated layers of the three-quantum well unit shown in FIG. 2 with $L_b$=60 nm and $l_b$=6 nm thick $Al_xGa_{1-x}As$ barriers.

The spectral response bandwidth is further increased by reducing barrier thickness 206 separating each well of the three well unit ($l_b$ in FIG. 2). FIG. 4 shows the responsivity spectrum of a broad-band quantum well infrared photodetector in which $l_b$ is reduced to 6 nm. The device structure has 35 repeated units laid out in an array with $l_b$=6 nm thick $Al_xGa_{1-x}As$ barriers. The thicknesses of the three quantum wells are designed to respond at peak wavelengths of 13.5 $\mu$m, 14.3 $\mu$m and 15.5 $\mu$m respectively.

Each of the three quantum wells is separated by a 60 nm thick ($L_b$) $Al_xGa_{1-x}As$ barrier 204 as before. FIG. 4 shows a broadening of the spectral response up to $\Delta\lambda$ of approximately 6.0 $\mu$m, i.e., the full width at the half maximum from 10.0 to 16.0 $\mu$m. This broadening of the spectral response bandwidth ($\Delta\lambda/\lambda_p$ of approximately 46%) is more than a 450% increase from a typical prior art quantum well infrared photodetector.

One of the advantages of this quantum well unit is its flexibility of varying design criteria such as layer thickness and barrier composition to achieve the desired spectral bandwidth. Broadening the spectral bandwidth allows a low cost material such as $GaAs/Al_xGa_{1-x}As$ to be used to manufacture highly sensitive and uniform large area focal plane array for long wavelength infrared cameras. These cameras can utilize focal plane array size of 640×480 based on optimized GaAs/Al$_x$Ga$_{1-x}$As multi-quantum well structure. Also, the GaAs/Al$_x$Ga$_{1-x}$As material provides a high pixel-to-pixel uniformity. It also allows large area focal plane arrays to be manufactured making high resolution imaging possible.

A number of embodiments of the present invention have been described. Nevertheless, it will be understood that various modifications may be made without departing from the spirit and scope of the invention. For example, while the invention has been described in terms of a structure with three quantum wells, the claims cover an implementation of the structure with any number of quantum wells. Accordingly, other embodiments are within the scope of the following claims.

What is claimed is:

1. A broad-band quantum well infrared photodetector unit comprising:
a quantum well unit comprising first, second, and third quantum wells of variable widths, each of said quantum wells having two or more energy states, including a ground state, and being formed from GaAs material, wherein the ground states of at least two of said quantum wells are different; and
a plurality of barriers, including an outer barrier of a particular thickness separating quantum well units and at least two inner barriers separating the quantum wells, said variable widths and said barriers selected such that the quantum well unit has a spectral response bandwidth ($\Delta\lambda/\lambda p$) of at least 22%,
wherein each of the inner barriers has a thickness in a range of from about 2 nm to about 60 nm.

2. The quantum well unit of claim 1, wherein the plurality of barriers are formed from Al$_x$Ga$_{1-x}$As material with a particular Al content x.

3. The quantum well unit of claim 2, wherein the number of the plurality of barriers are four.

4. The quantum well unit of claim 3, wherein the widths of the first, second, and third quantum wells are varied to respond at peak wavelengths of 13.5 µm, 14.3 µm and 15.5 µm respectively, such that the full width of the spectral band at the half maximum covers 13.2 to 16.6 µm under the same biasing condition.

5. The quantum well unit of claim 2, wherein the thickness of the outer barrier of the plurality of barriers is 60 nm and the thickness of the at least one inner barrier of the plurality of barriers is 60 nm.

6. The quantum well unit of claim 3, wherein the thickness of the outer barriers is 60 nm and the thickness of the two inner barriers is 60 nm.

7. The quantum well unit of claim 4, wherein the thickness of the outer barriers is 60 nm and the thickness of the two inner barriers is 60 nm.

8. The quantum well unit of claim 2, wherein the thickness of the outer barrier of the plurality of barriers is 60 nm and the thickness of the at least one inner barrier of the plurality of barriers is 6 nm.

9. The quantum well unit of claim 3, wherein the thickness of the outer barriers is 60 nm and the thickness of the two inner barriers is 6 nm.

10. The quantum well unit of claim 4, wherein the thickness of the outer barriers is 60 nm and the thickness of the two inner barriers is 6 nm.

11. A multi-quantum well structure comprising:
a plurality of quantum well units, such that each quantum well unit includes a plurality of quantum wells of variable widths, each of said quantum wells having two energy states, including a ground state, and being formed from GaAs material, and a plurality of barriers,
wherein the widths of the quantum wells and barriers are selected such that the multi-quantum well structure is operative to detect light over a spectral response bandwidth ($\Delta\lambda/\lambda p$) of at least 22%, and
wherein each of the inner barriers has a thickness in a range of from about 2 nm to about 60 nm.

12. The multi-quantum well structure of claim 11, wherein the number of the plurality of quantum wells are three and the number of the plurality of barriers are three.

13. The multi-quantum well structure of claim 12, wherein said multi-quantum well structure is formed by 17 quantum well units.

14. A broad-band quantum well infrared photodetector unit comprising:
first, second, and third quantum wells of variable widths, each of said quantum wells having two or more energy states, including a ground state, and being formed from AlyGa1−yAs material with a particular Al content y, such that a variation of the Al content y allows the range of spectral band to vary over wider scale; and
a plurality of barriers, including an outer barrier of a particular thickness separating quantum well units and at least two inner barriers separating the quantum wells, each of said inner barriers having a thickness in a range of from about 2 nm to about 60 nm,
wherein the photodetector unit has a spectral response bandwidth ($\Delta\lambda/\lambda p$) of at least about 22%.

15. The quantum well unit of claim 14, wherein the plurality of barriers are formed from Al$_x$Ga$_{1-x}$As material with a particular Al content x.

16. The quantum well unit of claim 15, wherein the thickness of the outer barrier of the plurality of barriers is 60 nm and the thickness of the at least one inner barrier of the plurality of barriers is 60 nm.

17. The quantum well unit of claim 15, wherein the thickness of the outer barrier of the plurality of barriers is 60 nm and the thickness of the at least one inner barrier of the plurality of barriers is 6 nm.

18. A broad-band quantum well infrared photodetector unit comprising:
three quantum wells formed from GaAs material whose widths are varied to respond at peak wavelengths of 13.5 µm, 14.3 µm and 15.5 µm respectively, such that the full width of the spectral band at the half maximum covers 13.2 to 16.6 µm under the same biasing condition; and
four barriers formed from Al$_x$Ga$_{1-x}$As material with a particular Al content x, said barriers including an outer barrier and two inner barrier separating the three quantum wells, such that the thickness of the outer barrier is 60 nm and the thickness of the two inner barriers is 60 nm.

19. A broad-band quantum well infrared photodetector unit comprising:
three quantum wells formed from GaAs material whose widths are varied to respond at peak wavelengths of 13.5 µm, 14.3 µm and 15.5 µm respectively, such that the full width of the spectral band at the half maximum covers 13.2 to 16.6 µm under the same biasing condition; and four barriers formed from $Al_xGa_{1-x}As$ material with a particular Al content x, said barriers including an outer barrier and two inner barrier separating the three quantum wells, such that the thickness of the outer barrier is 60 nm and the thickness of the two inner barriers is 6 nm.

20. A broad-band quantum well infrared photodetector unit comprising:

three quantum wells formed from $Al_yGa_{1-y}As$ material with a particular Al content y, and the widths of the quantum wells are varied to respond at peak wavelengths of 13.5 μm, 14.3 μm and 15.5 μm respectively, such that the full width of the spectral band at the half maximum covers 13.2 to 16.6 μm under the same biasing condition; and four barriers formed from $Al_xGa_{1-x}As$ material with a particular Al content x, said barriers including an outer barrier and two inner barrier separating the three quantum wells, such that the thickness of the outer barrier is 60 nm and the thickness of the two inner barriers is 6 nm.

21. The quantum well unit of claim 1, wherein the spectral response (Δλ) of the quantum well unit is at least about 3.4 μm.

22. The quantum well unit of claim 1, wherein the spectral response (Δλ) of the quantum well unit is at least about 6.0 μm.

23. The quantum well unit of claim 1, wherein the spectral response bandwidth (Δλ/λp) is at least 40%.

24. The multi-quantum well structure of claim 11, wherein the spectral response bandwidth is at least 40%.

25. The multi-quantum well structure of claim 11, wherein the spectral response (Δλ) is at least about 3.4 μm.

26. The multi-quantum well structure of claim 11, wherein the spectral response (Δλ) is at least about 6.0 μm.

27. The broad-band quantum well infrared photodetector unit of claim 14, wherein the spectral response bandwidth is at least 40%.

28. The broad-band quantum well infrared photodetector unit of claim 14, wherein the spectral response (Δλ) is at least about 3.4 μm.

29. The broad-band quantum well infrared photodetector unit of claim 14, wherein the spectral response (Δλ) is at least about 6.0 μm.

30. The quantum well unit of claim 1, wherein the thickness of each of the inner barriers is in a range of from about 6 nm to about 60 nm.

31. The quantum well unit of claim 11, wherein the thickness of each of the inner barriers is in a range of from about 6 nm to about 60 nm.

32. The quantum well unit of claim 14, wherein the thickness of each of the inner barriers is in a range of from about 6 nm to about 60 nm.

33. The quantum well unit of claim 1, wherein the inner barriers comprise an AlGaAs material.

* * * * *